(12) United States Patent
Yoshino et al.

(10) Patent No.: US 6,875,637 B2
(45) Date of Patent: Apr. 5, 2005

(54) SEMICONDUCTOR PACKAGE INSULATION FILM AND MANUFACTURING METHOD THEREOF

(75) Inventors: Makoto Yoshino, Beppu (JP); Kenji Masumoto, Hiji-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 6 days.

(21) Appl. No.: 09/909,013

(22) Filed: Jul. 19, 2001

(65) Prior Publication Data

US 2003/0017653 A1 Jan. 23, 2003

(30) Foreign Application Priority Data

Jul. 26, 2000 (JP) ........................................ 2000-225339

(51) Int. Cl.$^7$ ........................ H01L 21/50; H01L 21/46
(52) U.S. Cl. ...................... 438/125; 438/113; 438/460
(58) Field of Search ............................... 438/106, 125, 438/126, 460, 112, 113, 114; 361/748, 749, 756, 761

(56) References Cited

U.S. PATENT DOCUMENTS

| | | | |
|---|---|---|---|
| 6,192,579 B1 * | 2/2001 | Hayashi et al. | 29/846 |
| 6,200,824 B1 * | 3/2001 | Hashimoto | 438/15 |
| 6,235,555 B1 * | 5/2001 | Cho | 438/112 |

* cited by examiner

Primary Examiner—Evan Pert
Assistant Examiner—Scott B. Geyer
(74) Attorney, Agent, or Firm—W. Daniel Swayze, Jr.; W. James Brady; Frederick J. Telecky, Jr.

(57) ABSTRACT

An insulation film for providing an insulation substrate carrying a semiconductor chip of a semiconductor package. Insulation film 10 is provided with rows of opposing sprocket holes 12 formed on either edge of the above mentioned insulation film, and through holes 14 are disposed two-dimensionally between the rows of sprocket holes 12. Pitch p between through holes 14 is determined by the relationship m p=n L (i.e., n and m are integers, and n<m), wherein pitch of the sprocket holes is taken to be L. Through holes 14 are selectively utilized during formation of the desired circuit pattern upon insulation film 10 according to size of the manufactured semiconductor package.

11 Claims, 8 Drawing Sheets

SEMICONDUCTOR PACKAGE INSULATION FILM AND MANUFACTURING METHOD THEREOF

FIELD OF THE INVENTION

The present invention relates to a semiconductor package insulation film and manufacturing method thereof.

BACKGROUND OF THE INVENTION

As small-sized electronic apparatuses such as cellular telephones, portable computers, etc. have become widespread, demand has increased for reduction of the size of semiconductor packages installed in such apparatuses. Semiconductor packages having a BGA or LGA architecture are appropriate for such size reduction since such semiconductor packages can be arranged two-dimensionally at the bottom surface of the device along the external terminals of the device as an interface with the external board. However, in comparison to devices of the conventional QFP (Quad Flat Package), such semiconductor packages are generally deficient in that per unit manufacturing cost is high.

Thermoplastic insulation film comprising polyimide resin or other resins is used for manufacture of a BGA or LGA architecture semiconductor package. Multiple identical circuit patterns are formed along the length-wise and transverse directions of this insulation film. A semiconductor chip is mounted upon each circuit pattern, and a mold is used for sealing to produce multiple semiconductor packages simultaneously in a row.

FIG. 10 shows one example of a thermoplastic film used for production of this type of semiconductor package. An insulation film 110 has a row of sprocket holes 112 along both edges of the insulation film, thereby making possible winding and movement thereof. Between both rows of the above mentioned sprocket holes of the insulation film, multiple circuit patterns 114 are formed comprising copper or some other metal (in this figure, the actual circuit pattern is omitted, and only the region thereof is indicated.). Beneath the region of this circuit pattern 114, multiple through holes are formed prior to formation of this circuit (not shown in the figure). Furthermore, upon the upper surface of insulation film 110, together with the above mentioned circuit pattern 114 are formed conductor pattern 116 and bridge 118 connecting together the conductor pattern and each circuit pattern 114. Conductor pattern 116 and bridge 118 are electricity-supply patterns for performance of plating of each circuit pattern 114. A cathode of a direct current power supply is connected to the above mentioned conductor pattern, and direct current electrolysis is carried out in a solution containing plating metal ions. Therefore patterned plating occurs upon the insulation film containing the circuit patterns. Platting of each circuit pattern is a technique required for improvement of corrosion resistance and solder leakage resistance of the circuit pattern. Formation of circuit pattern 114 upon that above mentioned insulation film 110, electrical-supply conductor pattern 116, and bridge 118 is accomplished by first pasting metal foil over the entire region of the insulation film, followed by use of lithographic technology to remove unnecessary parts, i.e. the interior region of the circuit pattern and the perimeter region of each circuit pattern.

The production of a conventional semiconductor package using the above mentioned insulation film, as shown in FIG. 10, includes the steps of mounting of a semiconductor chip upon each circuit pattern 114 of insulation film 110 and connecting the electrode pad of each semiconductor chip with circuit pattern 114 by wire bonding. Thereafter, insulation film 110 is placed in a mold, and each semiconductor chip is molded. Here the mold has a cavity corresponding to each of the semiconductor chips. Molding compound is injected into the interior of each cavity, thereby sealing the semiconductor chip and forming the exterior shape of the semiconductor package by this molding compound. Then after formation of solder pads upon the insulation through holes as exterior contacting terminals at the backside of the insulation film, a punch-out jig is used to punch out each semiconductor package one-after-another from the insulation film.

However, manufacture of a semiconductor package using the above mentioned conventional insulation film has several problems as described below.

(1) When manufacturing semiconductor packages of different sizes, according to size, design is required of a corresponding circuit pattern and an insulation film having corresponding through holes. Therefore, according to the size of the manufactured semiconductor package, placement of through holes in the above mentioned insulation film must be changed, and a mold (referred to hereinafter as a stamper) must be newly prepared for through hole aperturing for each type of package. As a result, problems arise such as prolongation of TAT (turn around time) and increase of manufacturing cost during semiconductor package manufacture using conventional insulation film.

(2) During conventional semiconductor package manufacturing, resin is molded corresponding to each semiconductor package, and a punch-out jig is used for dicing into separate units. Therefore reduction of the spacing between each circuit pattern upon the insulation film is difficult. Therefore a limited number of semiconductor packages can be manufactured from a single piece of insulation film, and many places upon the insulation film are unused as a substrate for the semiconductor package. This results in increased manufacturing cost and prevents improvement of productivity.

Therefore an object of the present invention is to provide an insulation film that can be used universally with good non-specificity, thereby reducing manufacturing cost and turn around time of the semiconductor package.

Moreover, another object of the present invention is to increase the number of semiconductor packages per unit surface area that can be manufactured from insulation film, and reduce the discarded region of the insulation film, thereby lowering manufacturing cost of the semiconductor package.

SUMMARY OF THE INVENTION

The present invention relates to an insulation film for providing an insulating substrate for mounting of a semiconductor chip in a semiconductor package. The insulation film of the present invention is used for providing an insulation substrate for carrying a semiconductor chip of a semiconductor package; wherein two rows of sprocket holes are provided comprising a plurality of sprocket holes formed at a pitch L along both edges of the insulation film; a plurality of through holes is formed two-dimensionally at a pitch p between the rows of sprocket holes; and the plurality of through holes can be used selectively as through holes for the insulation substrate of the semiconductor package according to size of the semiconductor package.

Ideally the pitch L and the pitch p preferably satisfy the following equation: m p=n L (i.e., n and m are integers that satisfy the equation n<m).

The above mentioned insulation film has the following: a plurality of circuit patterns formed two-dimensionally upon the insulation film according to size of the semiconductor package; and a for-plating-electricity-supply-use conductor pattern electrically connected with the plurality of circuit patterns.

In the above mentioned case, the for-plating-electricity-supply-use conductor pattern preferably has the following: a main line surrounding the perimeter of the plurality of circuit patterns; and a sub-line electrically connecting each of the circuit patterns to the main line.

Moreover, the present invention relates to a method for the manufacture of an insulation film for providing an insulation substrate for carrying a semiconductor chip of a semiconductor package. The manufacturing method of the insulation film of the present invention comprises the steps of: preparing insulation film having two rows of sprocket holes comprising a plurality of sprocket holes formed at a pitch L along both edges of the insulation film; and forming a plurality of through holes two-dimensionally at a pitch p between the rows of sprocket holes.

Ideally, the above mentioned pitch L and the pitch p satisfy the following equation: m p=n L (i.e., n and m are integers that satisfy the equation n<m).

In the above mentioned case, the above mentioned step of forming the through holes further preferably comprises the steps of: forming the through holes by collective punching out at the effective sprocket hole formation width of the through holes along the transverse direction of the insulation film in a region of length n L along the length-wise direction of the insulation film; moving the insulation film just a length n L in the length-wise direction by means of the sprocket holes; and repeating these two steps alternately.

Moreover, the present invention can further comprise a step of forming a plurality of circuit patterns two-dimensionally upon the insulation film according to size of the semiconductor package and a for-plating-electricity-supply-use conductor pattern electrically connected with the plurality of circuit patterns.

Furthermore, the present invention relates to a method for the manufacture of a semiconductor package utilizing the above mentioned insulation film. The method for manufacture of a semiconductor package of the present invention comprises the steps of: preparing insulation film having the following: two rows of sprocket holes comprising a plurality of sprocket holes formed at a pitch L along both edges of the insulation film, a plurality of through holes formed two-dimensionally at a pitch p between the rows of sprocket holes, a plurality of circuit patterns formed two-dimensionally upon the insulation film according to size of the semiconductor package, a for-plating-electricity-supply-use conductor pattern electrically connected with the plurality of circuit patterns having a main line surrounding the perimeter of the plurality of circuit patterns and a sub-line electrically connecting each of the circuit patterns to the main line; mounting of a semiconductor chip within a respective prescribed region of each circuit pattern of the insulation film and electrically connecting the semiconductor chips with the circuit patterns; performing resin sealing for partitioning off each region enclosed by the main line of the conductor pattern; and cutting apart into individual semiconductor packages by dicing along the sub-lines of the insulation film.

During the above mentioned method of manufacture of the semiconductor package, the method preferably further comprises a step of plating each of the circuit patterns upon the insulation film using the for-plating-electricity-supply-use conductor pattern. In this case, the above mentioned dicing step is preferably carried out by use of a dicing blade having a blade trim width wider than the wiring width of the sub-line of the conductor pattern so that the sub-line is not left behind upon the insulation film.

Figure 1:
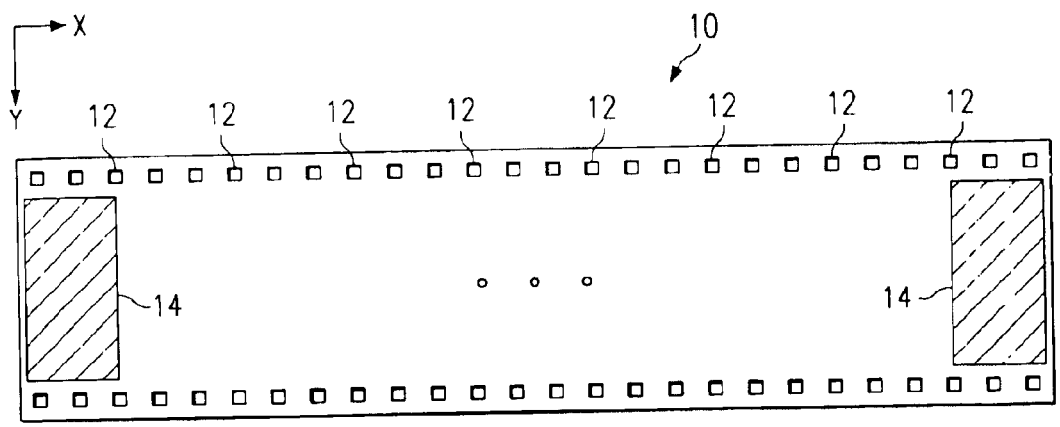
FIG. 1 is a frontal view of the insulation film of a working example of the present invention.

| REFERENCE NUMERALS AND SYMBOLS AS SHOWN IN THE FIGS. | |
|---|---|
| p | pitch of through holes |
| L | pitch of sprocket holes |
| 10 | insulation film |
| 12 | sprocket holes |
| 14 | through holes |
| 16 | circuit pattern |
| 18 | for-plating-use conductor pattern |
| 20 | main line |
| 22 | sub-line |
| 90 | semiconductor chip |
| 92 | conductor wire |
| 94 | molding |
| 96 | solder bump |
| 98 | through hole |
| 100 | dicing blade |
| 102 | sprocket hole |
| 104 | dicing table |

DESCRIPTION OF EMBODIMENTS

Figure 2:
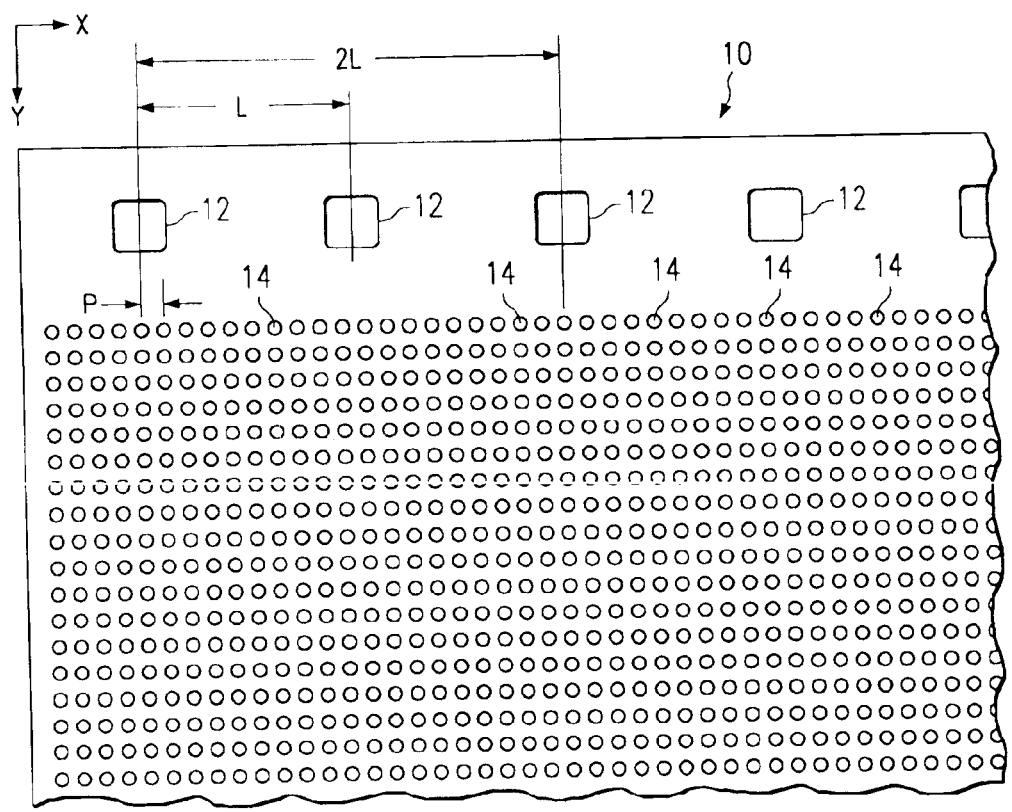
FIG. 2 is a magnified drawing of a part of FIG. 1.

The present invention is explained below by means of figures showing working examples. FIG. 1 is a frontal view showing the insulation film of a working example of the present invention. FIG. 2 is a drawing showing a magnified part thereof. Item 10 within these figures is the insulation film formed as an insulation substrate of a LGA package equipped two-dimensionally with solder bumps. Therefore universal use is possible as an insulation substrate for LGA packages of different sizes. Circuit patterns are formed for this substrate according to the size of the LGA package. Insulation film 10 within these figures has rows of sprocket holes 12 disposed at both edges along the length-wise direction. Sprocket holes 12, in the same manner as sprocket holes formed in general insulation film, drive the insulation film by means of a sprocket which engages with the insulation film. The sprocket holes 12 of insulation film 10 of the present invention, in order to be handled by the sprockets used for driving a general insulation film, in the same manner as a general insulation film, preferably have a pitch L equal to 4.75 mm as a working example. Insulation film 10 is initially fed as an elongated film. As shown in FIG. 1, molding is carried out by placement in a mold having the desired dimensions, followed by cutting. Insulation film 10 of working example 1 is a polyimide resin film that is 50 μm thick and 48.175 mm wide.

Insulation film 10 is equipped with through holes 14 disposed two-dimensionally without a gap in the utilized region between the rows of sprocket holes 12. As explained below, through holes 14 are punched out by a jig (called a stamper) at a desired pitch determined by pitch L of sprocket holes 12 so as to be formed one-after-another along the length-wise direction (i.e., x direction) of the insulation film. Pitch p of the through holes along the transverse direction (i.e., y direction) and along the above mentioned x direction of the insulation film is fixed and is therefore determined based upon the pitch of solder bumps of the LGA package that is being manufactured. Pitch p is also determined by a relationship with pitch L of the sprocket holes 12. That is to say, through holes 14 have a pitch p given by the following equation: m p=n L (i.e., n and m are integers, and n<m).

Figure 3:
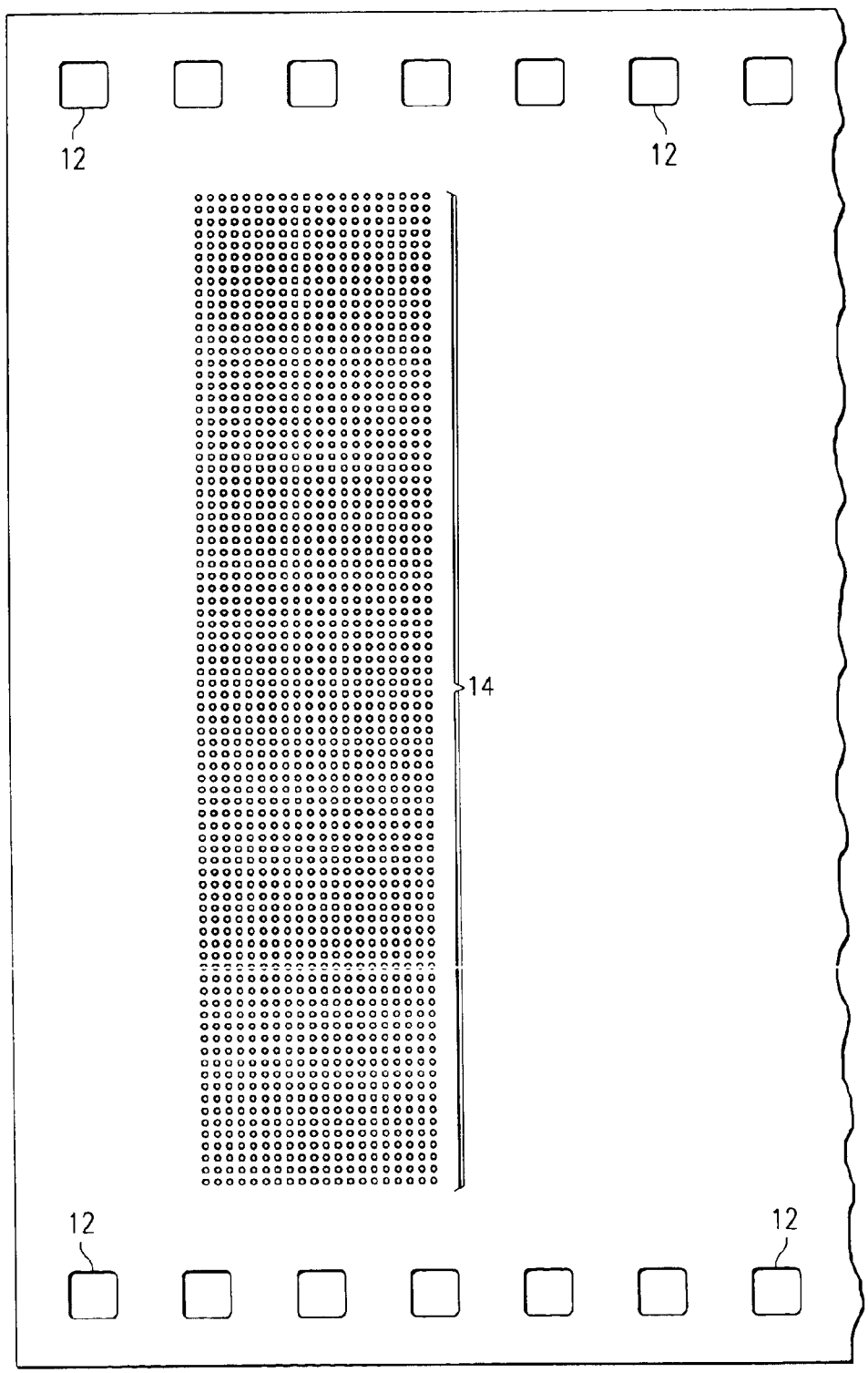
FIG. 3 is a frontal view of insulation film showing through holes formed upon the insulation film by a single shot of a stamper.

For the working example shown in the figures, n is equal to 2, and m is equal to 19. By this means, 19 through holes 14 are formed in the region defined by 2 sprocket holes 12. Moreover, 79 through holes are formed along the entire utilized region along the transverse direction (y direction) of insulation film 10 of this working example. Here n and m are determined in relationship to x direction length once through holes 14 have been opened. Generally the aperturing capacity of a stamper (i.e., the count of through holes that can be opened at once) is less than 2000 holes, so n and m are determined while taking this into consideration. The stamper of the present working example forms 19×79=1501 through holes collectively. FIG. 3 shows through holes 14 formed upon insulation film 10 due to a single punching out operation (referred to hereinafter as one shot) of the stamper. As insulation film 10 is driven each 1 step (1 step drives the insulation film by just 2L) using sprocket holes 12, the stamper carries out the punch out operation, and through holes 14 are formed upon insulation film 10 without gaps. Since pitch p of through holes 14 and pitch L of sprocket holes 12 are related, the above mentioned fixed pitch p can also be attained between through holes 14 of each adjacent shot. Therefore the entire region of insulation film 14 can be made with the above mentioned fixed pitch p. Therefore the fixed pitch p of through holes 14 is maintained over the entire region of insulation film 10.

Figure 4:
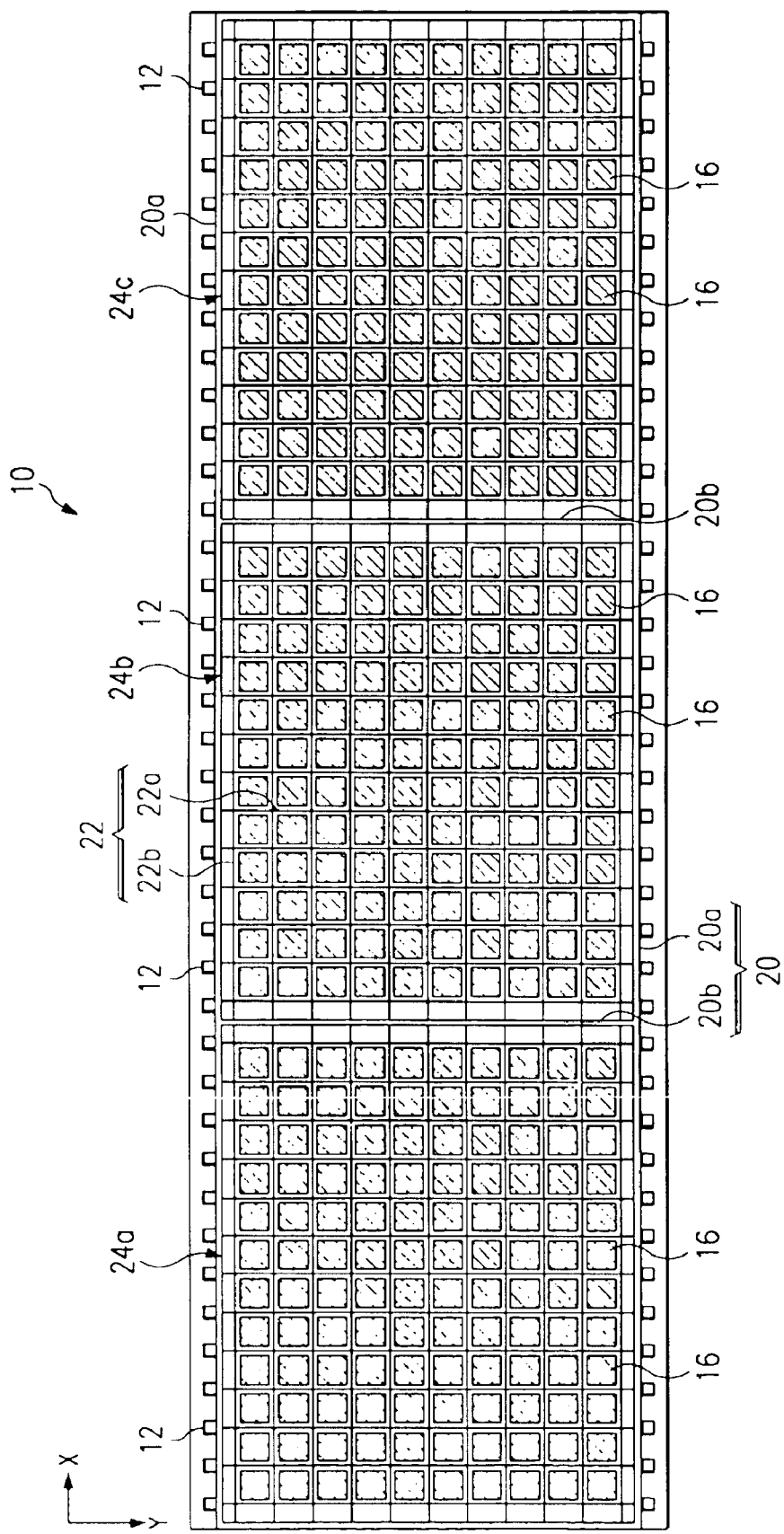
FIG. 4 shows formation of a conductor pattern including a circuit pattern upon the insulation film for formation of an LGA package of comparatively small size.
Figure 5:
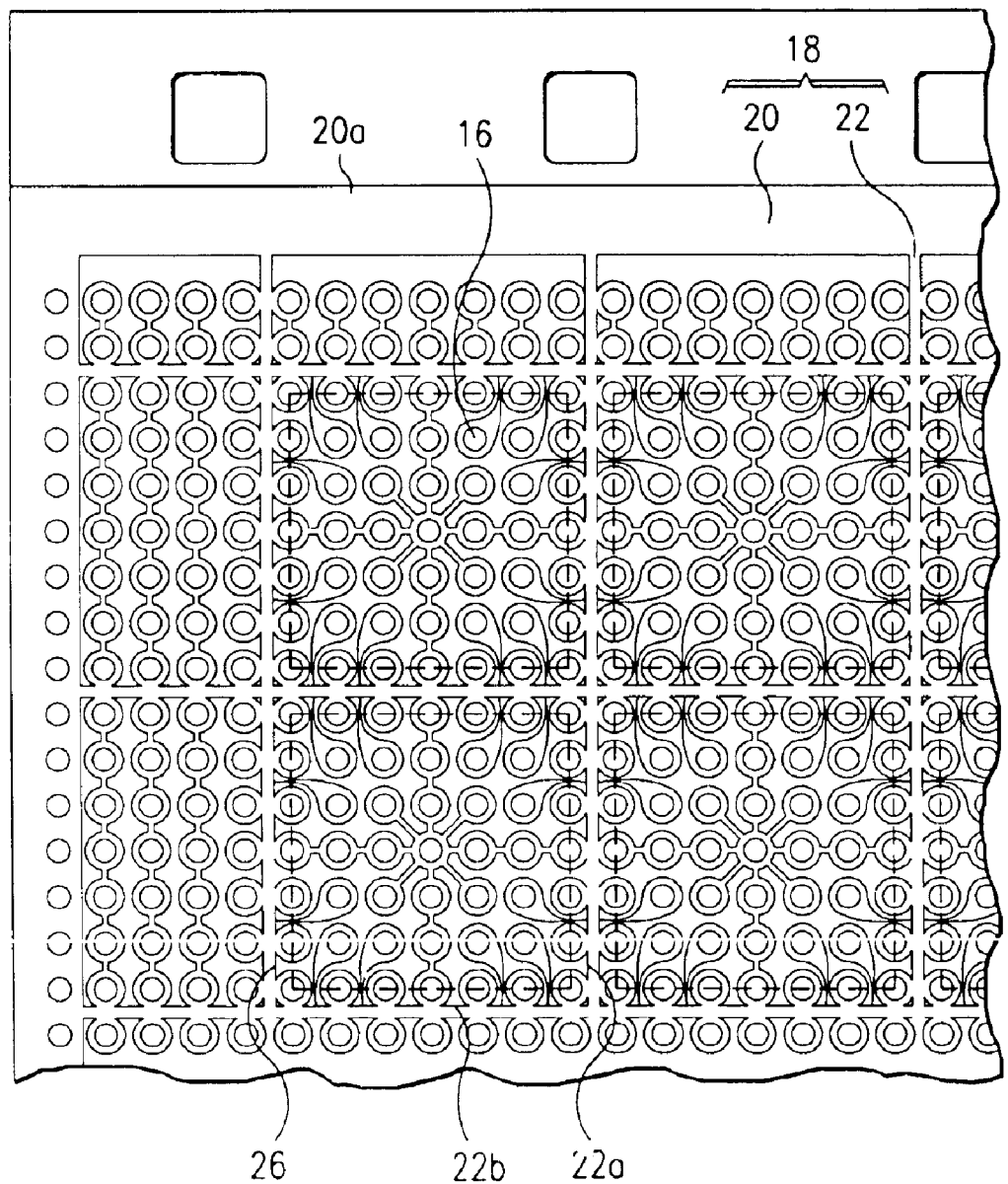
FIG. 5 is a magnified drawing of a part of FIG. 4.

FIG. 4 and FIG. 5 show formation of conductor patterns including circuit patterns upon the above mentioned insulation film 10 for formation of a comparatively small sized LGA package. FIG. 4 is an overall drawing. FIG. 5 is a magnified drawing of a part thereof. By use of an insulation film having a conductor pattern as shown in these figures, 360 LGA packages of 3 mm square size are formed simultaneously, and each package is provided with 5×5 through holes 14 carrying solder bumps as external terminals.

Within these figures, insulation film 10 is equipped with a conductor pattern 18 used for plating and comprising relatively wide main lines 20 and comparatively thick sub-lines 22. These patterns are formed across the entire region of insulation film 10 using one-step vaporization-deposition of a metal film (preferably copper film) and lithographic technology (i.e., after coating with resist, required or unnecessary parts are masked and exposed, followed by etching). Although FIG. 5 indicates each through hole 14 formed upon insulation film 10 by solid lines, actually all through holes 14 are covered by circuit pattern 16 or pattern 18 used for plating.

Insulation film 10 has a properly spaced array of numerous circuit patterns 16 placed along the row and column directions. Each circuit pattern 16 is formed within a single region demarcated by sub-lines 22 of the conductor pattern as explained below. The example shown in these figures utilizes 360 circuit patterns 16 upon insulation film 10. Although the specific construction of these circuit patterns is omitted from the figures, each of these circuit patterns 16 actually comprises multiple lands covering and corresponding to through holes 14 formed upon the insulation film, multiple connection lands for wire bonding with the semiconductor chip, and multiple segments connecting together these lands. External shape of the semiconductor package formed by this circuit pattern 16 of FIG. 5 is indicated by line segment 26. During the semiconductor device manufacturing process described below, insulation film 10 is diced along line segment 26, and the resulting cut film is used as the insulation substrate of the semiconductor package.

For-plating-use semiconductor pattern 18 comprises main lines 20 and sub-lines 22. Main lines 20 of the conductive pattern form a frame of interconnects comprising relatively wide lines formed so as to mark off circuit patterns 16 upon insulation film 10 as multiple blocks (three blocks 24A through 24C are shown in the FIG. 4 example.). That is to say, main line 20 comprises side lines 20a formed along both sides of insulation film 10 and transverse lines 20b formed at prescribed intervals along the length-wise direction (i.e., formed at each of multiple prescribed circuit patterns). During the circuit pattern 16 plating step, a cathode of a direct current power supply is directly connected to this main line 20. In the present working example, transverse line 20b of the main line is formed upon a single row of through holes 14, thereby covering these through holes 14. For one preferred embodiment, line width of this side line 20a is 0.6 to 1.0 mm, and line width of transverse line 20b is 0.3 to 2.0 mm.

Sub-lines 22 of the conductor pattern are a lattice of comparatively thin interconnects formed within each block 24A through 24C enclosed by the above mentioned main line 20. That is to say, sub-lines 22 comprise transverse lines 22a connecting together at both ends with side lines 20a, and side lines 22b connecting together at both ends with transverse lines 20b of the above mentioned main lines. Each of the above mentioned circuit patterns 16 are formed within a lattice opening formed by this transverse line 22a and side line 22b. Moreover, a circuit pattern is not formed in the region enclosed by sub-line 22 adjacent to main line 20. Each sub-line 22 is formed between and along a row of through holes 14. Each constituent part of each circuit pattern 16 enclosed by sub-line 22 extends toward and connects with the enclosing sub-line 22.

Line width of sub-line 22 is determined in relationship to the trim width of the dicing blade used during the semiconductor package manufacturing process using this insulation film as explained below. During dicing of each semiconductor package, a dicing blade is used to dice and separate insulation film 10 at the position of sub-line 22. This sub-line 22 must not be left behind upon insulation film 10 after the dicing of the present manufacturing process since sub-line 22 would otherwise cause short circuits between interconnects within each pattern 16. Sub-line 22 is removed by use of a dicing blade having a trim width wider than that of the line width of sub-line 22. For one preferred working embodiment, when trim width of the dicing blade is about 150 to 250 μm, line width of this sub-line 22 is thin, i.e. 100 μm or less and more preferably 50 μm.

Figure 6:
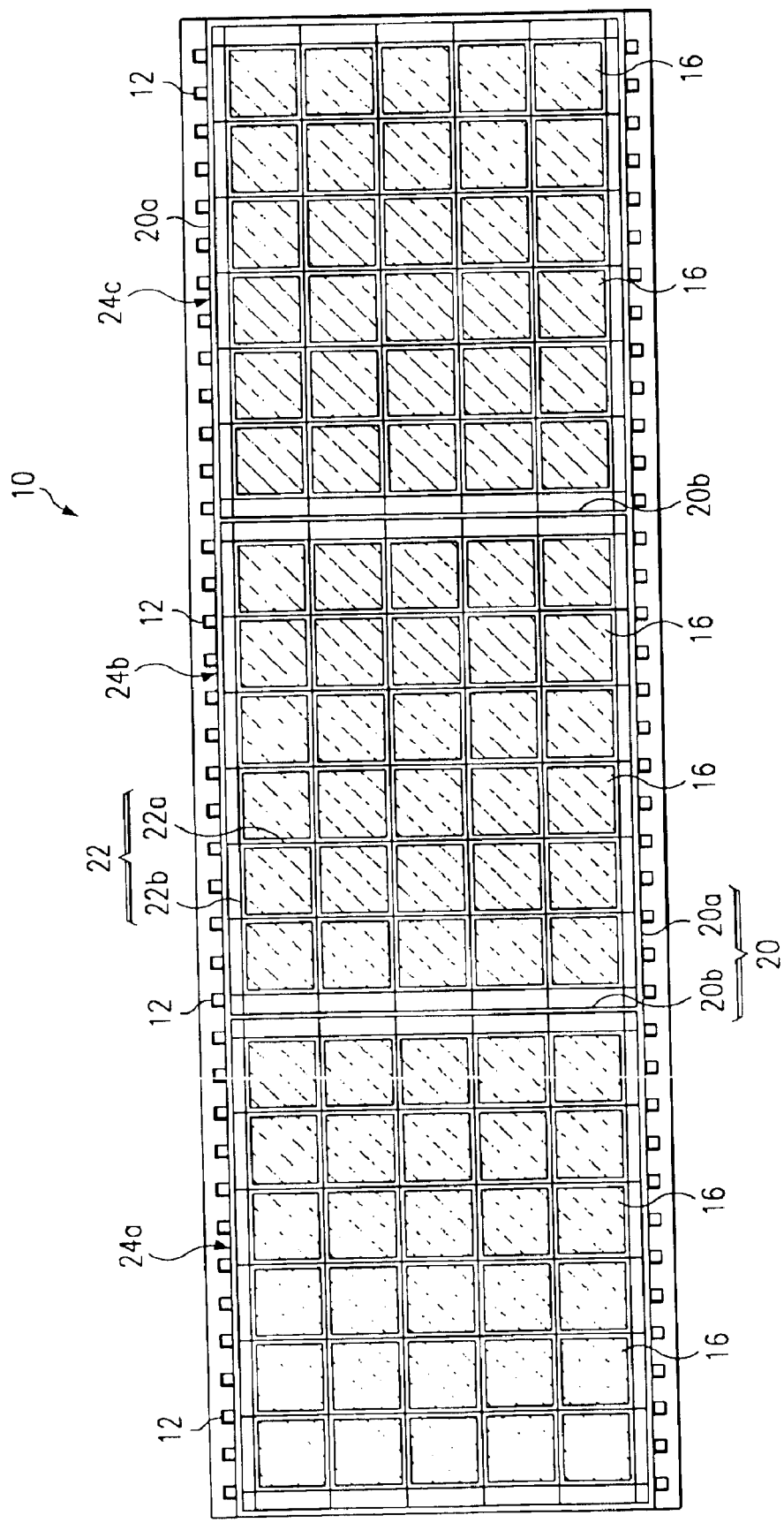
FIG. 6 shows formation of a conductor pattern including a circuit pattern upon the insulation film for formation of an LGA package of comparatively large size.
Figure 7:
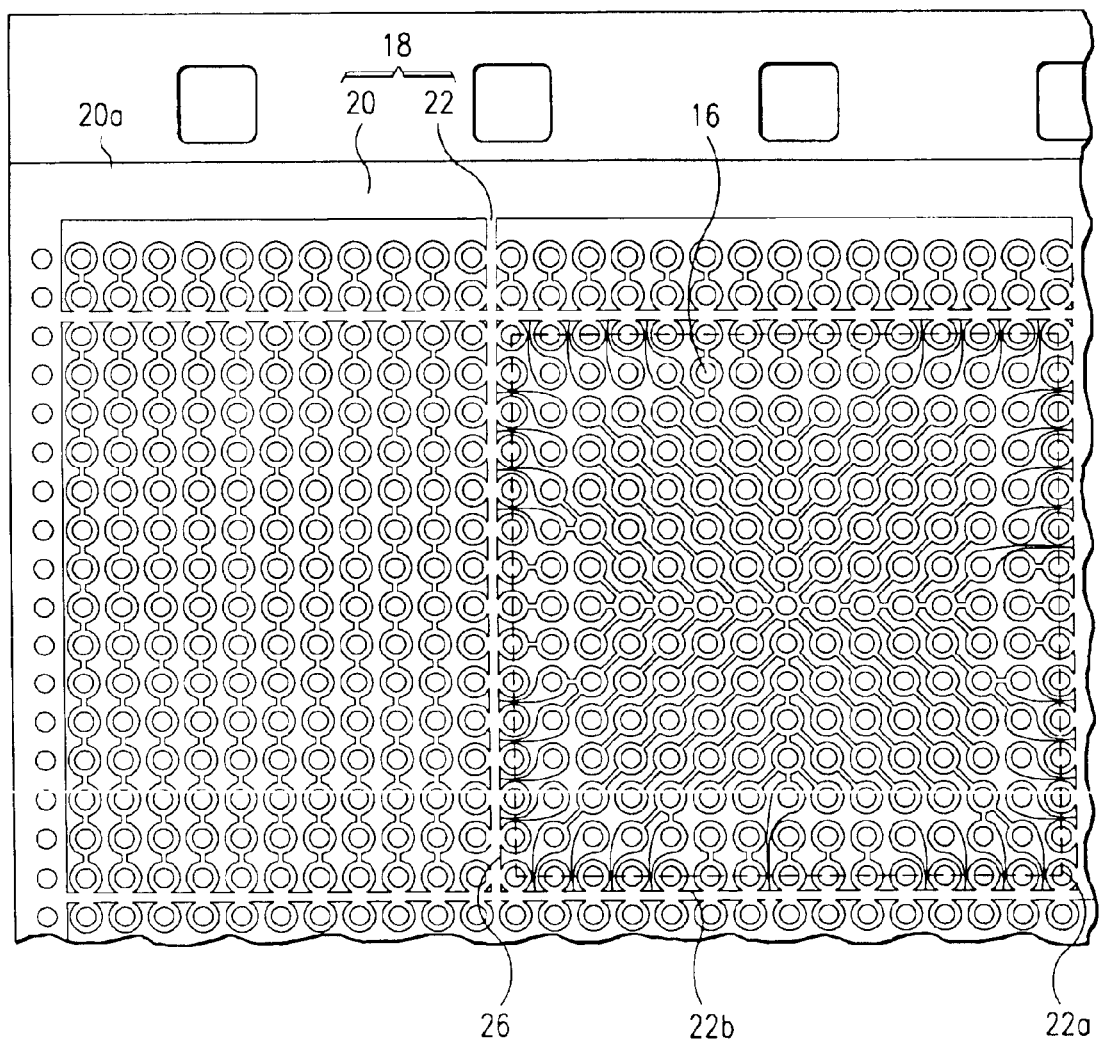
FIG. 7 is a magnified drawing of a part of FIG. 6.

FIG. 6 and FIG. 7 show formation of conductor patterns including circuit patterns upon the above mentioned insulation film 10 of FIG. 1 for formation of a comparatively large sized LGA package. FIG. 6 is an overall drawing. FIG. 7 is a magnified drawing of a part thereof. By use of an insulation film having a conductor pattern as shown in these figures, 90 LGA packages of 7 mm square size are formed simultaneously, and each package is provided with 13×13 through holes 14 carrying solder bumps as external terminals.

Within these figures as indicated by FIG. 4 and FIG. 5 for formation of a comparatively small sized package, upon insulation film 10 are formed circuit pattern 16 and for-plating use conductor pattern 18 designed according to the package size. That is to say, the interiors of three blocks 24A through 24C of insulation film 10 enclosed by main lines 20 of for-plating-use conductor pattern 18 are further divided by these sub-lines 22. Circuit pattern 16 is provided within the region demarcated by sub-line 22. Within the example shown in these figures, 30 circuit patterns 16 are formed for each block. Constituent parts of each circuit pattern 16, as shown in FIG. 7, are connected to the enclosing sub-line 22, thereby making possible a supply of electricity to the circuit pattern during plating treatment.

As explained above, by formation of different conductor patterns upon the same insulation film 10, insulation substrates can be provided for different sizes of LGA packages.

Figure 8:
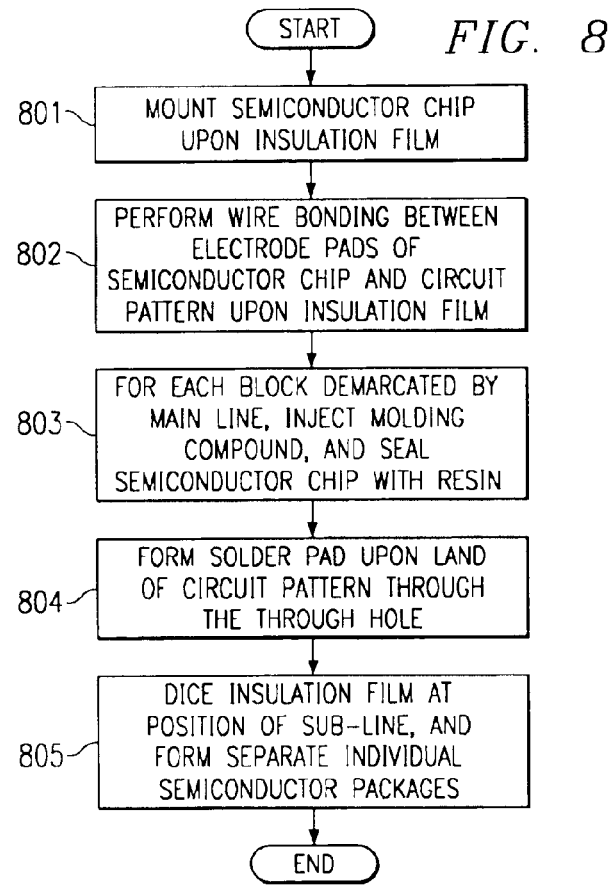
FIG. 8 is a flow chart showing manufacturing steps for a semiconductor package according to the present invention.
Figure 10:
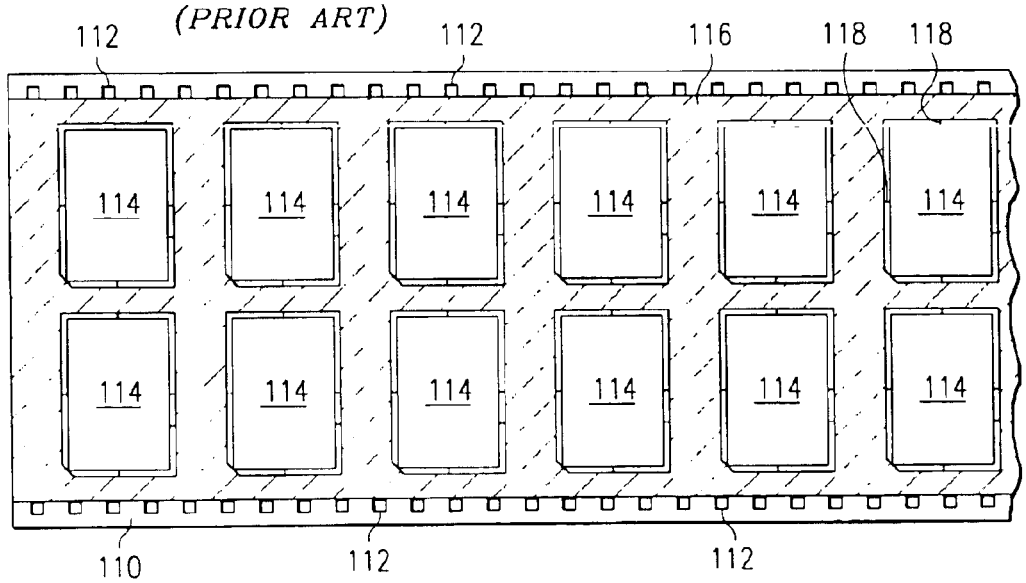
FIG. 10 shows a pattern structure upon thermoplastic insulation film of conventional construction used for production of a semiconductor package.

The manufacturing process of the semiconductor package using the above mentioned insulation film 10 will next be explained. FIG. 8 is a flow chart showing the present manufacturing process. FIG. 9 is a simplified side view for each step of FIG. 8. Prior to the steps of these figures, insulation film 10 as shown FIG. 1 is prepared as insulation film equipped with numerous gap-free through holes between sprocket holes. Formation of the through holes in the insulation film, as explained previously with regard to FIG. 3, is carried out by a stamping operation while the insulation film is advanced 2 pitches of the sprocket holes at a time. Here a single type of stamper can be used for through hole formation. The conventional preparation of stampers having different pin arrays for each different size of semiconductor package is unnecessary.

Desired circuit patterns and for-plating-use patterns are formed thereafter upon one surface of the insulation film equipped with these through holes. These patterns are formed across the entire region of insulation film 10 using one-step vaporization-deposition of a metal film (preferably copper film) and lithographic technology to remove unnecessary metal parts. During the next step, the desired plating of circuit pattern 16 is carried out. A cathode of a direct current power supply is connected to the above mentioned main line 20 of the for-plating-use conductor pattern, and direct current electrolysis is carried out in a solution containing plating metal ions. Furthermore, upon the region carrying a semiconductor chip of each circuit pattern 16, an adhesive is applied comprising thermoplastic polyimide or another such material.

Figure 9A:
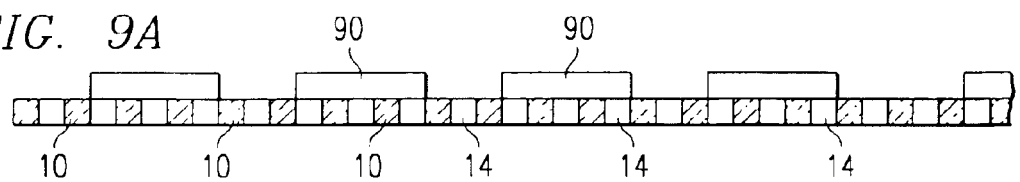
FIG. 9 are side views corresponding to each of the steps of FIG. 8.
Figure 9B:
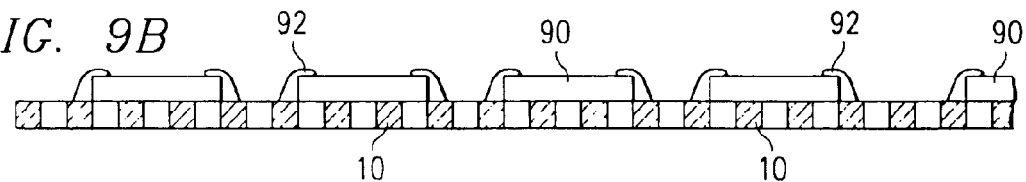

During step 801 of FIG. 8 and FIG. 9(A), insulation film 10 is placed upon the surface of the circuit pattern, and semiconductor chip 90 is carried upon the circuit pattern coated by the above mentioned adhesive. In this state and after passage through a reflow furnace, the above mentioned adhesive is melted so that each semiconductor chip 90 is fixed upon insulation film 10. Thereafter during step 802 and FIG. 9(B), wire bonding (conductor wire 92) is carried out between each for the electrode pads of semiconductor chip 90 and the corresponding connection land of the circuit pattern.

Figure 9C:
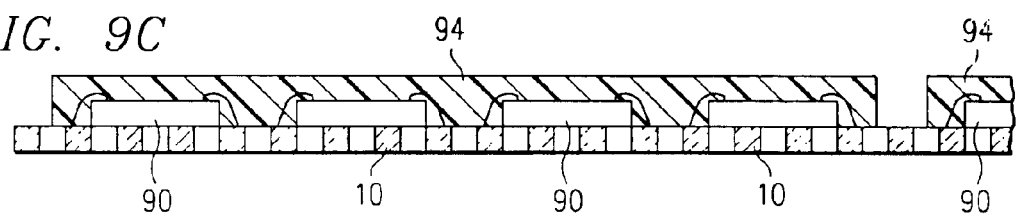

During step 803 and FIG. 9(C), resin sealing of each semiconductor chip 90 is carried out by means of a mold 94. This molding step uses a mold having cavities (i.e. three cavities) corresponding to the regions of blocks 24A through 24C (refer to FIG. 4 and FIG. 6) demarcated by main line 20. Molding compound fed to the mold flows through runners (each cavity in this working example is provided with two runners) into each cavity, and multiple semiconductor chips 90 placed within these blocks are covered simultaneously. The region upon insulation film 10 covered by mold 94 includes the above mentioned sub-line 22 of the conductor pattern. Moreover, the above mentioned main line 20 of conductor pattern 18 may be partially or entirely included.

Figure 9D:
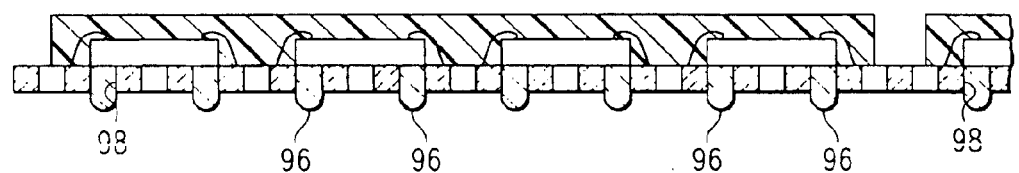

Thereafter during step 804 and FIG. 9(D), solder bumps 96, i.e. LGA architecture lands, are formed as external terminals at the backside of insulation film 10. Each solder bump 96 is electrically connected via through hole 98 formed in the insulation film to the land of circuit pattern 16. A metal mask having holes corresponding to the location of through holes 98 is placed along the backside of insulation film 10, and a squeegee is used to press and pack the insulation film into these holes. After passage through a reflow furnace, these solder bumps 96 can be formed. As would probably be clear to one skilled in the art, the process of the present invention can be used for the manufacture of a BGA architecture package by placing and fixing solder balls upon the through holes packed with solder.

Figure 9E:
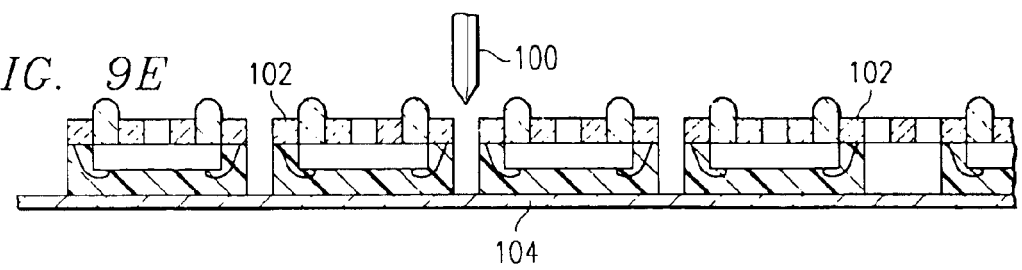

Thereafter during step 805 and FIG. 9(E), a dicing press 100 is used for dicing of insulation film 10 and molding 94 for separation into separate semiconductor packages 102. Dicing is carried out by fixing insulation film 10 upon a dicing table 104 as shown in the figure with the molding side downward and by using a wide dicing blade having a trim width wider than the sub-lines of the semiconductor pattern as explained previously. Dicing is carried out at the location of these sub-lines 22. By this means, insulation film 10 and molding 94 can be separated into each semiconductor package unit, and sub-line 22 electrically connecting each interconnect within each circuit pattern is removed.

As described above, multiple semiconductor packages 102 are produced simultaneously using the above mentioned insulation film 10. During the above mentioned manufacturing, most of the region enclosed by main line 20 of the conductor pattern upon insulation film 10 (with the exceptions of the region of sub-line 22 removed by dicing and the region adjacent to main line 20) is used as a region of the substrate of the semiconductor package. The region of discarded insulation film becomes extremely small.

Working examples of the present invention were explained above by the use of figures. The applicable scope of the present invention is clearly not limited to the items shown in the above mentioned working examples. In the above mentioned working examples, the semiconductor chip was connected to the circuit pattern upon the insulation film by wire bonding. However, a package using so-called free chip mounting by mounting of the semiconductor chip with the major surface downward can also be used with advantage for the insulation film and above mentioned manufacturing method of the present invention. Moreover, a stamper was used to open 19×79 holes in a single operation in the region of two pitches of sprocket holes during the above mentioned working example. However, as allowed by aperturing capacity of the stamper, a greater number of through holes (e.g., 38×79 holes formed in each 4 pitch region of sprocket holes) may be opened in a single operation.

The following results are obtained by the present invention as described above.

(1) Even when manufacturing semiconductor packages of different sizes, a single type of insulation film may be prepared equipped with through holes according to the present invention. Moreover, a single type of stamper may also be used for opening the through holes, thereby improving semiconductor package productivity and cost.

(2) By use of the semiconductor package manufacturing method of the present invention, the count of semiconductor packages that can be manufactured from a single piece of insulation film increases dramatically, thereby improving productivity of such manufacturing. Manufacturing of the semiconductor package using the present insulation film minimizes to the greatest extent possible the discarded region and the quantity of utilized molding compound. This reduces cost of the semiconductor package.

What is claimed is:

1. A method for manufacture of a semiconductor package comprising the steps of: providing an insulation film, forming two rows of sprocket holes comprising a plurality of sprocket holes formed at a pitch L along both edges of the insulation film, forming a two-dimensional array of through holes between the rows of sprocket holes, each through hole in said array spaced from adjacent through holes by a pitch p, forming a two-dimensional plurality of circuit patterns upon the insulation film according to size of the semiconductor package, forming a conductor pattern electrically connected with the plurality of circuit patterns having a main line surrounding a perimeter of the plurality of circuit patterns and a sub-line electrically connecting each of the circuit patterns to the main line;

mounting a semiconductor chip within a respective prescribed region of each circuit pattern of the insulation film and electrically connecting the semiconductor chip with the circuit pattern;

performing resin sealing for partitioning off each region enclosed by the main line of the conductor pattern; and cutting apart into individual semiconductor packages by dicing along the sub-lines of the insulation film, wherein the dicing step is carried out by use of a dicing blade having a blade trim width wider than the wiring width of the sub-line of the conductor pattern whereby the sub-line is not left behind upon the insulation film.

2. The method for manufacture of an insulation film according to claim 1 wherein the pitch L and the pitch p satisfy the following equation: m p=n L wherein n and m are integers that satisfy the equation n<m.

3. The method for manufacture of an insulation film according to claim 2 wherein the step of forming the through holes further comprises the steps of:

forming the through holes by collective punching out at the effective sprocket hole formation width of the through holes along the transverse direction of the insulation film in a region of length n L along the length-wise direction of the insulation film;

moving the insulation film a length n L in the length-wise direction by means of the sprocket holes; and repeating these two steps alternately.

4. The method for manufacture of an insulation film according to claim 3 wherein the method further comprises a step of forming a two-dimensional array of circuit patterns upon the insulation film according to size of the semiconductor package and a conductor pattern electrically connected with the plurality of circuit patterns.

5. The method for manufacture of an insulation film according to claim 2 wherein the method further comprises a step of forming a two-dimensional array of circuit patterns upon the insulation film according to size of the semiconductor package and a conductor pattern electrically connected with the array of circuit patterns.

6. The method for manufacture of a semiconductor package according to claim 1 wherein the method further comprises the step of plating each of the circuit patterns upon the insulation film using the conductor pattern.

7. A method for manufacture of a semiconductor package comprising the steps of: providing an insulation film, forming two rows of sprocket holes comprising a plurality of sprocket holes formed at a pitch L along both edges of the insulation film, forming a two-dimensional array of through holes between the rows of sprocket holes, each through hole in said array spaced from adjacent through holes by a pitch p, forming a two-dimensional plurality of circuit patterns upon the insulation film according to size of the semiconductor package, forming a conductor pattern electrically connected with the plurality of circuit patterns having a main line surrounding a perimeter of the plurality of circuit patterns and a sub-line electrically connecting each of the circuit patterns to the main line;

mounting a semiconductor chip within a respective prescribed region of each circuit pattern of the insulation film and electrically connecting the semiconductor chip with the circuit pattern;

performing resin sealing for partitioning off each region enclosed by the main line of the conductor pattern; and cutting apart into individual semiconductor packages by dicing along the sub-lines of the insulation film, wherein the method further comprises the step of plating each of the circuit patterns upon the insulation film using the conductor pattern, and wherein the dicing step is carried out by use of a dicing blade having a blade trim width wider than the wiring width of the sub-line of the conductor pattern whereby the sub-line is not left behind upon the insulation film.

8. The method of claim 7 wherein said step of providing an insulation film comprises:

providing an insulation film having rows of sprocket holes at a pitch L along the edges of said film, and a two-dimensional array of through holes in said film between the rows of sprocket holes, said through holes arranged relative to one another in said array at a pitch p and continuously along and transversely across said film within circuit pattern regions on said film.

9. A method of packaging a semiconductor device, comprising the steps of:

providing an insulation film having rows of sprocket holes at a pitch L along the edges of said film and a two-dimensional array of through holes in said film between the rows of sprocket holes, said through holes arranged relative to one another in said array at a pitch p;

mounting a semiconductor chip over a number of said through holes;

sealing said semiconductor chip and a portion of said insulation film in resin; and cutting said insulation film surrounding said semiconductor chip to release said resin-sealed chip from the remainder of said insulation film.

wherein said step of providing an insulation film comprises:

providing an insulation film having rows of sprocket holes at a pitch L along the edges of said film, and a two-dimensional array of through holes in said film between the rows of sprocket holes, said through holes arranged relative to one another in said array at a pitch p and continuously along and transversely across said film within circuit pattern regions on said film, and wherein said circuit pattern regions are separated by sub-lines of a conductor pattern, and wherein said step of cutting said insulation film comprises cutting said film with a blade having a blade trim width wider than said sub-line is not left behind upon the insulation film after said cutting step.

10. The method of claim 9, further comprising the step of depositing solder in selected ones of said number of through holes.

11. The method of claim 9, further comprising the step of depositing metal in selected ones of said number of through holes.

* * * * *